United States Patent [19]
Levy

[11] Patent Number: 5,604,750
[45] Date of Patent: Feb. 18, 1997

[54] METHOD FOR VOLTAGE SETUP OF INTEGRATED CIRCUIT TESTER

[75] Inventor: Paul S. Levy, Chandler, Ariz.

[73] Assignee: VLSI Technology, Inc., San Jose, Calif.

[21] Appl. No.: 332,678

[22] Filed: Nov. 1, 1994

[51] Int. Cl.$^6$ ................................................. G01R 31/28
[52] U.S. Cl. ..................... 371/22.1; 371/25.1; 371/22.6; 324/765; 324/158.1
[58] Field of Search ..................... 324/765, 73.1, 324/158 R; 371/15.1, 20, 27, 22.1, 25.1, 22.6; 307/353

[56] References Cited

U.S. PATENT DOCUMENTS

| | | | |
|---|---|---|---|
| 4,348,759 | 9/1982 | Schnurmann | 371/20 |
| 4,903,267 | 2/1990 | Arai et al. | 371/27 |
| 5,146,161 | 9/1992 | Kiser | 324/158 R |
| 5,359,237 | 10/1994 | Pye | 307/353 |
| 5,402,079 | 3/1995 | Levy | 324/765 |

Primary Examiner—Robert W. Beausoliel, Jr.
Assistant Examiner—Nadeem Iqbal
Attorney, Agent, or Firm—LaValle D. Ptak

[57] ABSTRACT

A method for improving the setup time of an integrated circuit tester when a device under test is to be tested includes maintaining the voltage settings for supply voltage (Vdd), voltage input low level (VIL), voltage output low level (VOL), voltage input high level (VIH), and voltage output high level (VOH) in a DRAM memory in the tester. Consequently, the tester data base keeps the image of the last hardware setup, which was used to operate a test sequence on a device under test (DUT). To reduce the time for effecting an integrated circuit test on a new test, the software code for the new test compares the various voltage settings for the new test with the stored voltage settings for the last hardware setup. No hardware operating changes are made whenever the compared voltage settings agree; and only voltage settings which are incorrect are changed in the hardware in a sequential comparison of the various voltages. This software check and comparison takes place in microseconds or nanoseconds.

10 Claims, 1 Drawing Sheet

METHOD FOR VOLTAGE SETUP OF INTEGRATED CIRCUIT TESTER

One of the final steps in the manufacture of integrated circuit packages, prior to the release and sale of such packages, is performing a test operation of the package by applying operating voltages and checking the voltage input levels and voltage output levels in conjunction with a pre-established pattern of input and output signals. The particular voltages which are applied to any specific integrated package are established in accordance with the design parameters for that package. To do this, an integrated circuit tester (which may be any one of a number of standard commercial testers) is interconnected with the integrated circuit package under test by way of a tester load board which connects the pins of the integrated circuit package with selected ones of the output leads of the tester. The tester itself is set up to provide the designated operating voltages, the voltage input levels (both low and high) and voltage output levels (both low and high) which are to be applied during the test.

In the past, various manual switches on the load board and in the tester have been set in accordance with the pin designations and the operating parameters of the integrated circuit under test. Once such an initial setup has been made, subsequent sequential testing of the same integrated circuit packages may be effected fairly efficiently. The initial setup, particularly when a manual switch adjustment setting is used, is laborious and time consuming. In addition, when manual switch operation is used for setting the large number of voltage levels and circuit interconnections required to test a large scale integrated circuit, a relatively high chance of error exists. If the operating voltage Vdd applied to one or more pins of the integrated circuit device undergoing test (DUT) is somehow set to a higher voltage than specified, severe damage to the device may result. In addition, inadvertent setting of one or more of the voltage input levels or voltage output levels also may result in damage to the device under test, and possibly may be undetected, resulting in incomplete or erroneous testing of a large number of devices.

In order to shorten the time required for setup of the interconnections and operation of a tester with a device under test (DUT), automatic or semi-automatic interconnections between the tester and the DUT have been implemented. In typical systems currently being used, the tester settings for the various voltage levels applied to different pins of the DUT are compared with the programmed voltage settings, and are reset into the tester for each new DUT as part of the test cycle. The time required to do this is in the order of several milliseconds; but this operation must be established each time a new integrated circuit device is tested. Consequently, the several milliseconds required for this initial setup of the tester is a significant part of the total elapsed time of the test cycle.

It is desirable to shorten the total time for effecting the test of an integrated circuit device by an automated tester, to improve the overall efficiency of operation of a tester, and to increase the number of devices which may be tested within any given period of time. It also is desirable to accomplish this result automatically and efficiently to cause the tester voltage levels to be changed only when the previous voltage levels of the tester are not the same as those required for the new device under test.

SUMMARY OF THE INVENTION

It is an object of this invention to provide an improved method for reducing the time required to test an integrated circuit device.

It is another object of this invention to provide an improved method for programming an integrated circuit tester.

It is an additional object of this invention to change the hardware programming of an integrated circuit tester for testing of an integrated circuit device, only when the previous programming of the tester hardware is different from that required for the device under test.

It is a further object of this invention to automatically and accurately program the hardware of an integrated circuit tester for various voltages encountered during the test of an integrated circuit device in a reduced period of time.

In accordance with a preferred embodiment of this invention, a method is used to enhance the programming of hardware of an integrated circuit tester for an integrated circuit device under test, where the tester includes a memory storing the current hardware setup of the current (or previous) voltage settings for the last test operated by the tester. To accomplish this, a voltage comparison routine is initiated at the start of each section of the test program. The current voltage settings stored in a memory of the tester are compared with new software voltage settings for the next section of the test program; and the voltage settings in the tester are changed only if the stored voltage settings are different from the previous section's voltage settings.

DETAILED DESCRIPTION

Figure 1:
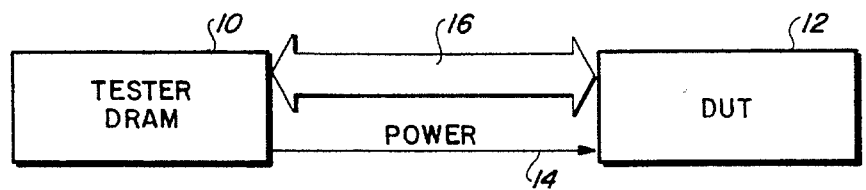
FIG. 1 is a block diagram representative of the operation of the method of a preferred embodiment of the invention.

Reference now should be made to the drawing, in which FIG. 1 is a diagrammatic representation of a standard integrated circuit tester 10, including an integral programmable random access memory (DRAM). As is well known, such an integrated circuit tester 10 is connected to the multiple pins of an integrated circuit device under test (DUT) 12 by means of a large number of circuit interconnections represented by the bus 16. As mentioned previously, these circuit connections between the tester 10 and the device under test 12 typically are effected by a tester "load board". The actual interconnection of the various leads in the bus 16, between the tester and the pins of the integrated circuit device under test, however, may be effected in any suitable manner. Also, as illustrated in FIG. 1, operating power Vdd is shown as being applied over a lead 14 to an appropriate pin or pins of the DUT 12.

The circuit shown in FIG. 1 is universally employed to perform an operating test of large scale integrated circuit packages having large numbers of output pins (typically, 96 to 512); and such tests are effected by the integrated circuit tester 10 to ensure that integrated circuit devices 12, operate in accordance with their established specifications when they are delivered to the ultimate customer. Such actual operating tests of these devices are employed because large scale integrated circuit devices frequently are employed as critical parts of complex electronic systems. If such integrated circuit devices fail to operate or perform as expected, potentially catastrophic failures of complex systems can result. Accordingly, actual testing of each device is commonly done in order to identify any integrated circuit devices with manufacturing or design flaws in them which prevent the devices from operating as expected.

As mentioned above, whenever a new DUT 12 is to be tested by the tester 10, all of the various voltages which are encountered in operation of the DUT 12 need to be set in the tester 10 for application to the DUT 12. These voltages include the DC operating voltage (Vdd), the voltage input low level (VIL), the voltage output low level (VOL), the voltage input high level (VIH), and the voltage output high level (VOH). It is important for these levels to be properly set in the correct sequence to the DUT 12, since damage to the DUT 12 can occur if improper voltages are applied. For example, damage to the DUT 12 may result if the operating voltage which is supplied by the tester 10, is more than a predetermined amount above the operating voltage with which the DUT 12 is designed to operate.

The amount of excess voltage which can cause such damage is not high, typically a VOH voltage 0.7 Volts above the designed Vdd for the DUT 12 can result in damage to the DUT 12. Similarly, voltage differences between the other voltages set in the tester 10 also can result in damage to the DUT 12 if the differences are greater than a predetermined amount. Consequently, it is very important that the voltages for DC operating power Vdd, as well as the other input and output voltage levels, are properly established before applying any of these voltages to the DUT 12 and performing the rest of the test sequence on the DUT 12 by the tester 10.

Modern integrated circuit testers 10 (such as Credence Model No. LT1101), also include a memory or register, indicated in the tester 10 as a DRAM memory, which stores the hardware setup. This includes the various voltages mentioned above which are applied by the tester 10 through the power lead 14 and the bus 16 to the DUT 12. In accordance with a preferred embodiment of this invention, the DRAM in the tester 10 maintains an image of the last hardware (or current) setup of the tester 10, which was used in performing a previous test of a DUT 12. This information is stored in designated memory locations in the tester DRAM.

In the past, when a new test was performed, the various values for the operating voltage, and other voltages mentioned above, were supplied to the tester 10, which then made the hardware voltage settings that were applied over the leads 14 and 16, in conformance with the corresponding voltages for a particular test. The time required to do this is in the order of several milliseconds. In terms of electronic computing speed, this is extremely slow. When this time is consumed for each time a test segment DUT 12 is initiated, the accumulated time for a large number of cycles of operation of the tester 10 becomes significant. Consequently, for any given tester, the number of devices 12 which may be tested in a given period of time is limited; and if the number of devices undergoing test is to be increased, more testers 10 need to be provided.

Figure 2:
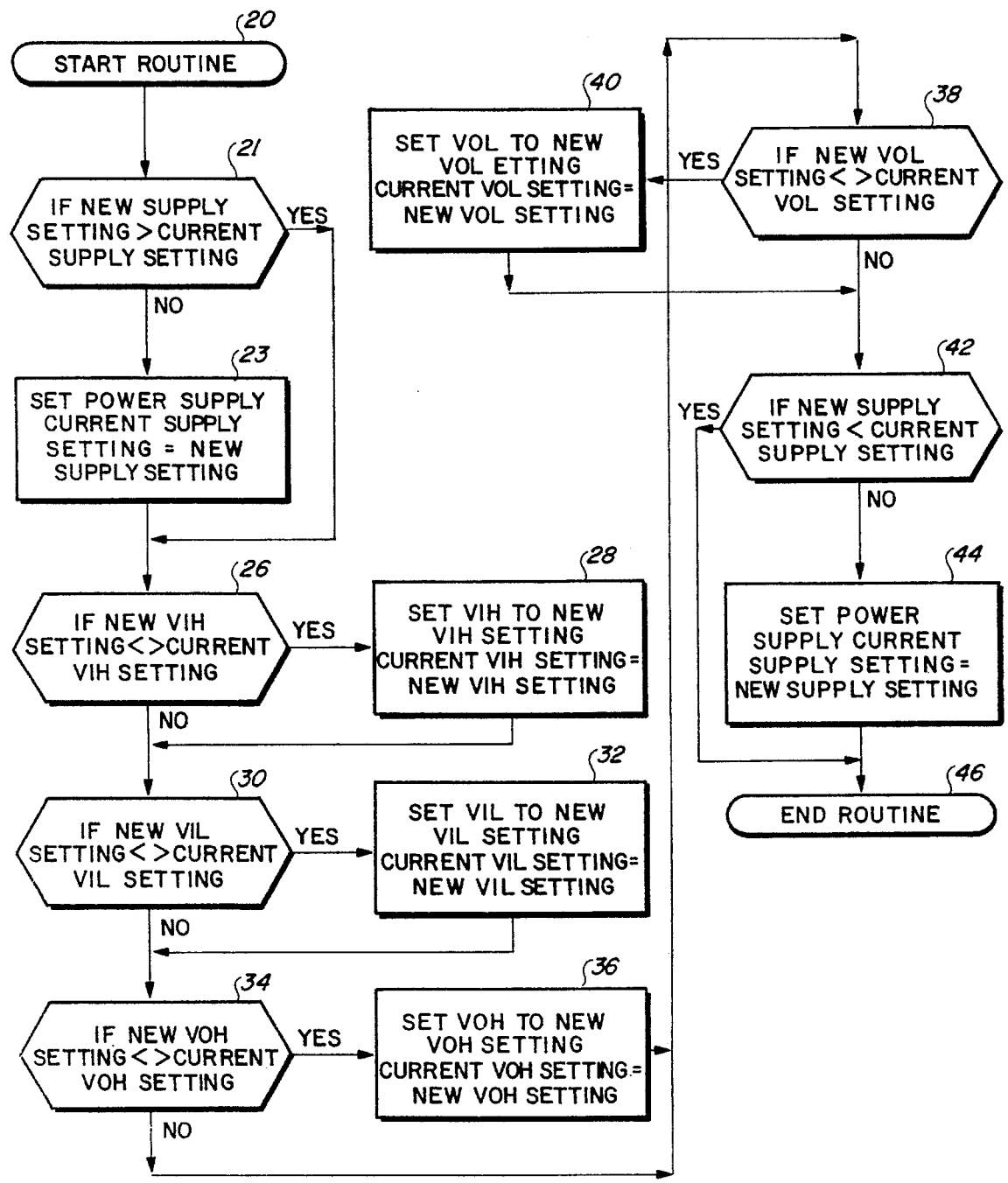
FIG. 2 is a flow chart of the method of a preferred embodiment of the invention.

In accordance with the method of operation of the preferred embodiment, as illustrated in FIG. 2, a software check and comparison of the stored voltage values in the DRAM of the tester 10 is effected at the beginning of a test segment DUT 12. Setting into hardware of any new values is not done unless the software voltage code or voltage value for the DUT 12 differ from the last or current stored hardware setup of these voltage values in the tester 10. If there are no differences, the comparison is made electronically in microseconds or nanoseconds, in contrast with the several millisecond required for standard procedures. If only some of the voltage settings need to be changed for a new test, the time for establishing these new voltage settings is the only hardware implementation which is required. The other voltage settings are left unchanged and are rapidly checked.

Reference now should be made to FIG. 2, which illustrates the technique for checking and establishing the direct current supply voltage Vdd, along with the other voltages, VIL, VOL, VIH, and VOH, mentioned above. At the beginning, the start routine 20 is effected; and the first check at 21 is to determine whether the new supply voltage setting Vdd is greater than the current or stored supply voltage setting Vdd in the DRAM 10 of the tester. If it is not, this means that the Vdd voltage level stored in the DRAM of the tester 10 is greater than the Vdd voltage level for the DUT 12 which is about to undergo test, and that possible damage could result. As a consequence, if the new Vdd setting is not greater than the current Vdd setting at 21, the power supply in the tester 10 as stored in the DRAM of the tester 10 is set to the new level at 23; so that the power supply setting Vdd in the tester DRAM 10 is equal to the new supply setting.

The next check is to determine if the new VIH setting is not equal to the current VIH setting in the tester 10 at 26. If they are not equal, the "YES" designation is used to set the VIH of the tester DRAM 10 to the VIH setting of the program for the DUT 12 at 28. Following the setting of VIH to the new VIH, the new VIL setting is checked at 30 with the current VIL setting stored in the tester DRAM 10. If the new VIL setting is not equal to the current VIL setting at 30, the positive or "YES" designation is used to set the VIL in the tester DRAM 10 to the new VIL setting at 32.

Next, the VOH and VOL settings are checked in sequence to determine if the new settings are not equal to the current settings. The VOH settings are compared at 34. If they are not equal, the VOH setting of the tester DRAM 10 is set to the new VOH setting at 36. Similarly, the new VOL setting is compared at 38 with the previous or current VOL setting of the tester DRAM 10. If they are not equal, the VOL setting in the tester DRAM 10 is set to the new VOL setting designated by the software code at 40.

Finally, another check of the new power supply setting Vdd is made to determine whether it is less than the current power supply setting in the tester DRAM 10 at 42. If it is, the routine is ended at 46. If the new power supply setting at 42 is not less than the current supply setting in the DRAM 10, however, the current power supply setting Vdd in the tester 10 is set to the new power supply setting Vdd at 44; and the routine then is ended at 46.

It should be noted that in the description of FIG. 2, which is given immediately above, each of the situations where the settings need to be changed is described; so that all of the voltages of the tester DRAM 10 are changed at the various stages 23, 28, 32, 36, 40 and 44 of the routine. Frequently, however, only some or none of the voltages need to be changed. In this case, various ones of the setting stages 23, 28, 32, 36, 40 or 44 may be eliminated, causing a rapid run through of the routine shown in FIG. 2. For example, if all of the designated voltages of the software code for the new DUT 12 are equal to the current (previous) voltage levels stored in the DRAM of the tester 10, the comparison sequence bypasses each of the stages or blocks 23, 28, 32, 36, 40 and 44; so that each interrogation moves to the next one from block 21 to 26, to 30, to 34, to 38, to 42, and finally, to the end of routine 46 in the least amount of time.

Similarly, if any one of the settings for VIH, VIL, VOH or VOL, for example, are equal to the current (previous) voltage setting in the tester DRAM 10, the "NO" or "N" output of the comparison check passes the routine operation to the very next one in the sequence, as is readily apparent from an examination of FIG. 2. Similarly, if the new power supply setting Vdd is equal to the current power supply setting Vdd, the "YES" outputs of both of the checking blocks 21 and 44 are obtained; and no setting of the tester 10 power supply Vdd needs to be made, since that setting already has been stored in the DRAM 10.

By utilizing the foregoing software check sequence of the voltage levels stored in the DRAM of the tester 10, the comparison, checking and resetting, if necessary, of the various voltage levels in the tester 10 is reduced to several microseconds or several nanoseconds, as opposed to the previous several millisecond time for accomplishing the same result using the prior art techniques. The order of precedence established by the routine of FIG. 2 is selected to change the hardware setup in the tester 10 in its proper order.

The foregoing description of the preferred embodiment of the invention should be taken as illustrative, and not as limiting. Various changes will occur to those skilled in the art for performing substantially the same function, in substantially the same way, to achieve substantially the same result, without departing from the true scope of the invention as defined in the appended claims.

I claim:

1. A method for programming of an integrated circuit tester for an integrated circuit device under test where said tester includes a memory storing the hardware setup of the current voltage settings for the last test operated by said tester, said method including the steps of:

providing voltage settings in software which constitute representations of designated hardware voltage settings for the next test to be performed;

comparing, via software, the current voltage settings for the hardware setup stored in a memory of a tester with said software voltage settings for said next test; and resetting hardware voltage settings in the memory of said tester for said next test only if the stored voltage settings are different from said software settings for said next test.

2. The method according to claim 1 wherein said voltage settings stored in said memory of said tester and said software representations of voltage settings comprise at least power supply voltage settings.

3. The method according to claim 2 further including the steps of comparing, via software, at least one additional voltage setting for the hardware setup stored in the memory of said tester with at least one corresponding additional software voltage setting for the next test to be performed; and changing said additional voltage setting in the memory of said tester to said additional software voltage setting if said current additional voltage setting for the hardware setup and said software voltage setting are not equal.

4. The method according to claim 3 wherein the step of comparing said additional voltage settings occurs after the step of comparing said software supply voltage setting with said current supply voltage setting.

5. The method according to claim 4 wherein said step of comparing said stored voltage settings and said software voltage settings comprises the step of determining if said software supply voltage setting is greater than the current supply voltage setting stored in the memory of said tester; and said step of changing voltage settings changes said supply voltage setting in said tester to said software supply voltage setting if said software supply voltage setting is less than said current supply voltage setting stored in the memory of said tester; and further including the steps of subsequently comparing said current supply voltage setting stored in the memory of said tester with said software supply voltage setting to determine if said software supply voltage setting is less than said current supply voltage setting stored in the memory of said tester; and changing the supply voltage setting in said tester to said software voltage setting if said software voltage setting is not less than said current supply voltage setting stored in the memory of said tester.

6. The method according to claim 4 wherein said additional voltage setting includes at least one of the voltage settings from the class of voltage settings comprising VIL, VOL, VIH, and VOH.

7. The method according to claim 6 wherein said step of comparing said additional voltage setting stored in said memory of said tester with said additional software voltage settings comprises comparing VIL settings, VOL settings, VIH settings, and VOH settings, and further including the step of changing the voltage settings in said tester for VIL, VOL, VIH, VOH whenever the current additional voltage setting stored in the memory of said tester is not equal to the corresponding additional software voltage setting for the current test.

8. The method according to claim 1 wherein said step of comparing said stored voltage settings and said software voltage settings comprises the step of determining if said software supply voltage setting is greater than the current supply voltage setting stored in the memory of said tester; and said step of changing voltage settings changes said supply voltage setting in said tester to said software supply voltage setting if said software supply voltage setting is less than said current supply voltage setting stored in the memory of said tester; and further including the steps of subsequently comparing said current supply voltage setting stored in the memory of said tester with said software supply voltage setting to determine if said software supply voltage setting is less than said current supply voltage setting stored in the memory of said tester; and changing the supply voltage setting in said tester to said software voltage setting if said software voltage setting is not less than said current supply voltage setting stored in the memory of said tester.

9. The method according to claim 3 wherein said additional voltage setting includes at least one of the voltage settings from the class of voltage settings comprising VIL, VOL, VIH, and VOH.

10. The method according to claim 9 wherein said step of comparing said additional voltage setting stored in said memory of said tester with said additional software voltage settings comprises comparing VIL settings, VOL settings, VIH settings, and VOH settings, and further including the step of changing the voltage settings in said tester for VIL, VOL, VIH, VOH whenever the current additional voltage setting stored in the memory of said tester is not equal to the corresponding additional software voltage setting for the current test.

* * * * *